(12) United States Patent
Chen et al.

(10) Patent No.: US 6,734,074 B2
(45) Date of Patent: May 11, 2004

(54) MICRO FABRICATION WITH VORTEX SHAPED SPIRALLY TOPOGRAPHICALLY TAPERED SPIRALLY PATTERNED CONDUCTOR LAYER AND METHOD FOR FABRICATION THEREOF

(75) Inventors: Wei-Su Chen, Hsin Chu (TW);
Hui-Chi Su, Kao-Hsung (TW);
Yi-Shian Chen, Yunlin (TW);
Chao-Chiun Liang, Taichung (TW);
Cheng Hong Lee, Taipei Hsien (TW);
Jeng En Juang, Taipei (TW)

(73) Assignee: Industrial Technology Research Institute, Hsin Chu (TW)

( * ) Notice: Subject to any disclaimer, the term of this patent is extended or adjusted under 35 U.S.C. 154(b) by 0 days.

(21) Appl. No.: 10/057,009

(22) Filed: Jan. 24, 2002

(65) Prior Publication Data

US 2003/0139015 A1 Jul. 24, 2003

(51) Int. Cl.[7] ............................................. H01L 21/20
(52) U.S. Cl. ........................................ 438/381; 257/531
(58) Field of Search ................................ 438/381, 171, 438/238; 257/531

(56) References Cited

U.S. PATENT DOCUMENTS

| 4,035,695 | A | * | 7/1977 | Knutson et al. ............. 361/400 |
| 5,287,036 | A | * | 2/1994 | Penunuri ................. 310/313 R |
| 6,414,585 | B1 | * | 7/2002 | Marcoux et al. ............. 338/309 |
| 6,452,247 | B1 | * | 9/2002 | Gardner ....................... 257/528 |
| 6,509,821 | B2 | * | 1/2003 | Oldfield ........................ 336/82 |

\* cited by examiner

Primary Examiner—David Nelms
Assistant Examiner—Quoc Hoang
(74) Attorney, Agent, or Firm—Tung & Associates

(57) ABSTRACT

Within both a micro fabrication and a method for fabricating the micro fabrication there is formed over a substrate a spirally patterned conductor layer spirally topographically tapered in a vortex shape. The spirally patterned conductor layer is particularly useful as a microelectronic inductor structure within a microelectronic fabrication.

10 Claims, 3 Drawing Sheets

MICRO FABRICATION WITH VORTEX SHAPED SPIRALLY TOPOGRAPHICALLY TAPERED SPIRALLY PATTERNED CONDUCTOR LAYER AND METHOD FOR FABRICATION THEREOF

BACKGROUND OF THE INVENTION

1. Field of the Invention

The present invention relates generally to micro fabrications. More particularly, the present invention relates to micro structures fabricated within micro fabrications.

2. Description of the Related Art

Microelectronic fabrications are fabricated from microelectronic substrates over which are formed patterned microelectronic conductor layers which are separated by microelectronic dielectric layers.

As microelectronic fabrication integration levels have increased and microelectronic fabrication functionality levels have increased, it has become common in the art of microelectronic fabrication to employ, in addition to generally conventional microelectronic device structures such as but not limited to transistor structures, resistor structures, diode structures and capacitor structures when fabricating microelectronic fabrications, less conventional microelectronic device structures, such as but not limited to inductor structures, when fabricating microelectronic fabrications. In particular, within microelectronic fabrications which are intended to be employed within high frequency microelectronic fabrication applications, such as mobile communications high frequency microelectronic fabrication applications, it is often common to employ microelectronic inductor structures within those microelectronic fabrications.

While microelectronic inductor structures are thus desirable within the art of microelectronic fabrication and often essential within the art of microelectronic fabrication, microelectronic inductor structures are nonetheless not entirely without problems in the art of microelectronic fabrication. In that regard, it is typically desirable in the art of microelectronic fabrication, but nonetheless not always readily achievable in the art of microelectronic fabrication, to efficiently fabricate within microelectronic fabrications microelectronic inductor structures with enhanced performance.

It is thus towards the goal of efficiently fabricating within microelectronic fabrications microelectronic inductor structures with enhanced performance that the present invention is directed.

SUMMARY OF THE INVENTION

A first object of the present invention is to provide a microelectronic inductor structure for use within a microelectronic fabrication, as well as a method for fabricating the microelectronic inductor structure for use within the microelectronic fabrication.

A second object of the present invention is to provide the microelectronic inductor structure and the method for fabricating the microelectronic inductor structure in accord with the first object of the present invention, wherein the microelectronic inductor structure is efficiently fabricated with enhanced performance.

In accord with the objects of the present invention, there is provided by the present invention a micro fabrication and a method for fabricating the micro fabrication.

In accord with the present invention, the micro fabrication comprises in a first instance a substrate. In addition, the micro fabrication also comprises, in a second instance, a spirally patterned conductor layer formed over the substrate, where the spirally patterned conductor layer is spirally topographically tapered in a vortex shape.

The micro fabrication in accord with the present invention contemplates a method for fabricating the micro fabrication in accord with the present invention.

Similarly, the spirally patterned conductor layer within the micro fabrication in accord with the present invention may be employed for fabricating within a microelectronic fabrication in accord with the present invention a microelectronic inductor structure.

The present invention provides a microelectronic inductor structure for use within a microelectronic fabrication, as well as a method for fabricating the microelectronic inductor structure for use within the microelectronic fabrication, wherein the microelectronic inductor structure is efficiently fabricated with enhanced performance.

The present invention realizes in part the foregoing objects by fabricating within a microelectronic fabrication a microelectronic inductor structure comprising a substrate having formed thereover a spirally patterned conductor layer, where the spirally patterned conductor layer is spirally topographically tapered in a vortex shape.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a microelectronic inductor structure for use within a microelectronic fabrication, as well as a method for fabricating the microelectronic inductor structure for use within the microelectronic fabrication, wherein the microelectronic inductor structure is efficiently fabricated with enhanced performance.

The present invention realizes in part the foregoing objects by fabricating within a microelectronic fabrication a microelectronic inductor structure comprising a substrate having formed thereover a spirally patterned conductor layer, where the spirally patterned conductor layer is spirally topographically tapered in a vortex shape.

Although the preferred embodiment of the present invention discloses the present invention most particularly within the context of a microelectronic inductor structure fabricated within a semiconductor integrated circuit microelectronic fabrication, the present invention is not intended to be so limited. Rather the present invention is intended to be directed towards micro structures, and correlating micro fabrications, which generally employ spirally patterned conductor layers. Such micro structures may include, but are not limited to microelectronic inductor structures, microelectronic resonator structures (i.e., microelectronic inductor structures coupled with microelectronic capacitor structures, microelectronic waveguide structures, micromechanical spring structures, microelectronic interconnect structures, microelectromagnetic valve structures, microelectromechanical resistive cavity heater structures and micromagnetic suspension structures.

Within the context of the present invention, a spirally patterned conductor layer is fabricated within a micro fabrication as a spirally topographically tapered spirally patterned conductor layer fabricated in a vortex shape over a substrate. The vortex shape may have its pointed end directed at least either towards or away from the substrate, while other intermediate angular dispositions of the vortex with respect to the substrate are also feasible and not precluded within the context of the present invention. Similarly, within the present invention the spirally patterned conductor layer has an open end across dimension of from about 50 to about 900 microns and a height of from about 50 to about 600 microns.

Referring now to FIG. 1 to FIG. 9, there is shown a series of schematic cross-sectional and schematic plan-view diagrams illustrating the results of progressive stages of fabricating, in accord with a preferred embodiment of the present invention, a microelectronic inductor structure within a semiconductor integrated circuit microelectronic fabrication.

Figure 1:
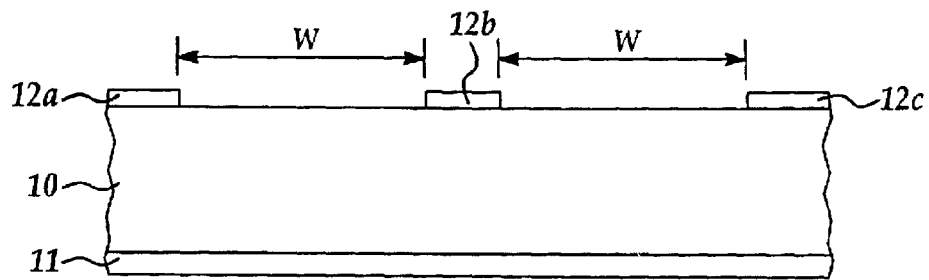
FIG. 1, FIG. 2, FIG. 3, FIG. 4, FIG. 5, FIG. 6, FIG. 7, FIG. 8, FIG. 9 and FIG. 10 show a series of schematic cross-sectional diagrams and schematic plan-view diagrams illustrating the results of progressive stages of fabricating, in accord with a preferred embodiment of the present invention, a microelectronic inductor structure within a semiconductor integrated circuit microelectronic fabrication.

Shown in FIG. 1 is a schematic cross-sectional diagram of the semiconductor integrated circuit microelectronic fabrication at an early stage in its fabrication in accord with the preferred embodiment of the present invention.

Shown in FIG. 1, in a first instance, is a monocrystalline silicon substrate 10 having formed upon a first of its sides a blanket first masking layer 11 and having formed upon an opposite second of its sides a series of patterned second masking layers 12a, 12b and 12c.

Within the preferred embodiment of the present invention with respect to the monocrystalline silicon substrate 10 (which may be either doped or undoped), and for reasons as will become clearer within the context of additional description which follows, the monocrystalline silicon substrate 10 is a (100) monocrystalline silicon substrate. Typically and preferably, the monocrystalline silicon substrate 10 has a thickness of from about 50 to about 600 microns.

Within the preferred embodiment of the present invention with respect to the blanket first masking layer 11 and the series of patterned second masking layers 12a, 12b and 12c, and although masking layers are known in the art of semiconductor integrated circuit microelectronic fabrication to be formed of hard masking materials (such as but not limited to silicon oxide hard masking materials, silicon nitride hard masking materials and silicon oxynitride hard masking materials) and photoresist masking materials (either of which may be employed within the present invention), for the preferred embodiment of the present invention, both the blanket first masking layer 11 and the series of patterned second masking layers 12a, 12b and 12c are formed of a hard masking material. Typically and preferably, the hard masking material is a silicon nitride hard masking material, typically and preferably formed to a thickness of from about 800 to about 104 angstroms upon both the first side of the monocrystalline silicon substrate 10 when forming the blanket first masking layer 11 and upon the second side of the monocrystalline silicon substrate 10 when forming the series of patterned second masking layers 12a, 12b and 12c.

As is illustrated within the schematic cross-sectional diagram of FIG. 1, each of the two pair of patterned second masking layers 12a and 12b, and 12b and 12c, is separated by a separation distance W of from about 70 to about 700 microns. As will be illustrated within a series of plan-view diagrams described in greater detail below, the separation distance W is intended as a bidirectional areal separation distance which defines the location of a pair of apertures to be formed within the monocrystalline silicon substrate 10.

Figure 2:
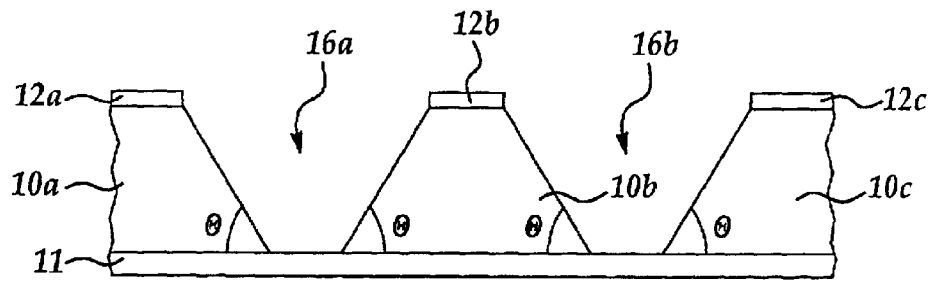

Referring now to FIG. 2, there is shown a schematic cross-sectional diagram illustrating the results of further processing of the semiconductor integrated circuit microelectronic fabrication whose schematic cross-sectional diagram is illustrated in FIG. 1.

Shown in FIG. 2 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 1, but wherein the monocrystalline silicon substrate 10 has been etched to form a series of patterned monocrystalline silicon substrate regions 10a, 10b and 10c, while employing the series of patterned second masking layers 12a, 12b and 12c as a series of etch mask layers and the blanket first masking layer 11 as an etch stop layer. As will be illustrated in part within the context of the series of accompanying plan-view diagrams, the series of patterned monocrystalline silicon substrate regions 10a, 10b and 10c, which are intended as representative in cross-section of a contiguous patterned monocrystalline silicon substrate, define a pair of apertures 16a and 16b which are in the form of inverted truncated square pyramidal vias.

Within the preferred embodiment of the present invention, the monocrystalline silicon substrate 10 is etched to form the series of patterned monocrystalline silicon substrate regions 10a, 10b and 10c while in particular employing an aqueous potassium hydroxide etchant solution at a concentration of from about 25 to about 35 weight percent potassium hydroxide and at an elevated temperature of from about 80 to about 90 degrees centigrade. As is further illustrated within the schematic cross-sectional diagram of FIG. 2, the series of patterned monocrystalline silicon substrate regions 10a, 10b and 10c is formed with a series of sidewalls of uniform positive taper (i.e., uniform positive incline) having an angle of incline e of 54.7 degrees, which corresponds with an angle of incline of crystal planes within the (100) monocrystalline silicon substrate 10. Thus, within the context of the preferred embodiment of the present invention, the monocrystalline silicon substrate 10 is uniquely directionally etched.

As is understood by a person skilled in the art, while the preferred embodiment of the present invention thus illustrates the present invention within the context of a unique directional etch of a (100) monocrystalline silicon substrate, the present invention is not intended to be uniquely so limited. Rather, the present invention will also provide value with respect to any substrate having formed therein an aperture having a sidewall with a taper, and generally a positive taper, whether or not a uniform sidewall taper and whether or not a 54.7 degree uniform sidewall taper. Thus, the present invention may also be employed within the context of substrates including but not limited to conductor substrates, semiconductor substrates and dielectric substrates which may masked and at least theoretically anisotropically or isotropically etched to provide therein an aperture having a sidewall having a taper. The aperture may be of shape such as but not limited to provide a circular conical shape, an elliptical conical shape, an irregular smooth perimeter conical shape, a triangular pyramidal shape, a rectangular pyramidal shape or a higher order polygonal pyramidal shape (any of the foregoing three shapes having equal or unequal base side lengths). Within the context of the present invention as disclosed and claimed, each of the foregoing shaped is understood to be a three-dimensional "vortex" shape providing an aperture.

Figure 3:
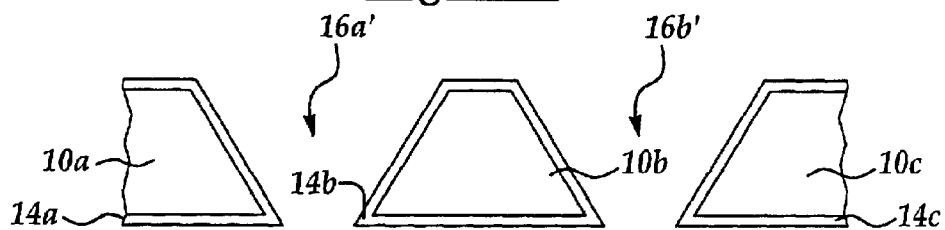

Referring now to FIG. 3, there is shown a schematic cross-sectional diagram illustrating the results of further processing of the semiconductor integrated circuit microelectronic fabrication whose schematic cross-sectional diagram is illustrated in FIG. 2.

Shown in FIG. 3 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 2, but wherein, in a first instance, the blanket first masking layer 11 and the series of patterned second masking layers 12a, 12b and 12c have been stripped from the series of patterned monocrystalline silicon substrate regions 10a, 10b and 10c.

Within the preferred embodiment of the present invention, the blanket first masking layer 11 and the series of patterned second masking layers 12a, 12b and 12c may be stripped from the series of patterned monocrystalline silicon substrate regions 10a, 10b and 10c as illustrated within the schematic cross-sectional diagram of FIG. 2 to provide in part the semiconductor integrated circuit microelectronic fabrication whose schematic cross-sectional diagram is illustrated in FIG. 3 while employing an aqueous phosphoric acid etchant solution, at elevated temperature.

Shown also within the schematic cross-sectional diagram of FIG. 3 is a series of conformal stress reducing layers 14a, 14b and 14c, formed upon the corresponding patterned monocrystalline silicon substrate regions 10a, 10b and 10c, which in turn further transforms the pair of apertures 16a and 16b as illustrated within the schematic cross-sectional diagram of FIG. 2 into a pair of stress reducing layer lined apertures 16a' and 16b'.

Within the preferred embodiment of the present invention with respect to the series of conformal stress reducing layers 14a, 14b and 14c, which are optional within the present invention and the preferred embodiment of the present invention, the series of conformal stress reducing layers 14a, 14b and 14c is typically and preferably formed of a comparatively silicon rich silicon nitride material, formed employing a plasma enhanced chemical vapor deposition (PECVD) method and having a silicon:nitrogen atomic ratio of from about 3:4 to about 1:1. Other methods and materials may, however, also be employed for forming the series of conformal stress reducing layers 14a, 14b and 14c. Typically and preferably, the series of conformal stress reducing layers 14a, 14b and 14c is formed to a single conformal thickness of from about 1000 to about angstroms each.

Figure 4:
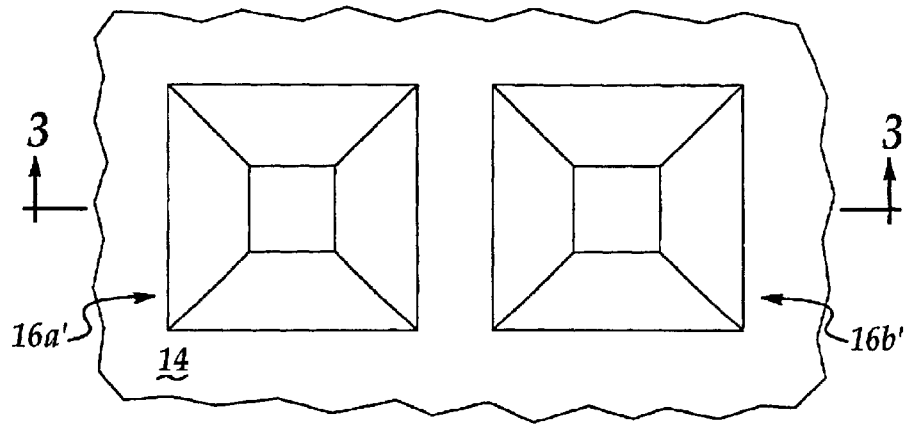

Referring now to FIG. 4, there is shown a schematic plan-view diagram of a semiconductor integrated circuit microelectronic fabrication which corresponds with the semiconductor integrated circuit microelectronic fabrication whose schematic cross-sectional diagram is illustrated in FIG. 3.

As is illustrated within the schematic plan-view diagram of FIG. 4, there is shown a blanket conformal stress reducing layer 14 which is intended to correspond with the series of conformal stress reducing layers 14a, 14b and 14c as illustrated within the schematic cross-sectional diagram of FIG. 3. Similarly, there is also illustrated the pair of stress reducing layer lined apertures 16a' and 16b' (which is formed as the pair of truncated inverted square pyramidal vias), as illustrated within the schematic cross-sectional diagram of FIG. 3.

Figure 5:
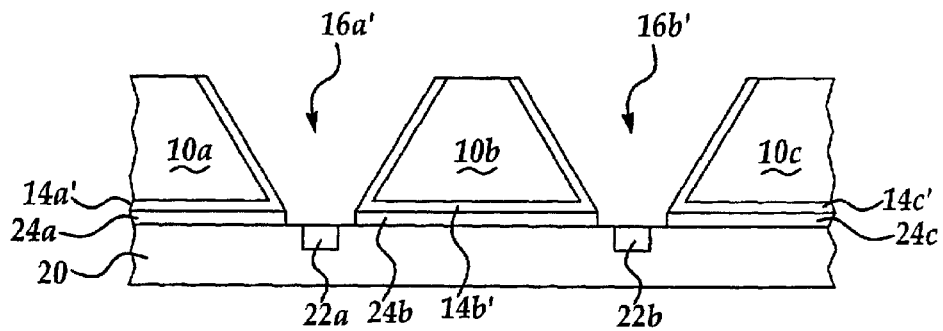

Referring now to FIG. 5, there is shown a schematic cross-sectional diagram illustrating the results of further processing of the semiconductor integrated circuit microelectronic fabrication whose schematic cross-sectional diagram is illustrated in FIG. 3 and whose schematic plan-view diagram is illustrated in FIG. 4.

Shown in FIG. 5 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 3 and whose schematic plan-view diagram is illustrated in FIG. 4, but wherein, in a first instance, the series of patterned monocrystallline silicon substrate regions 10a, 10b and 10c having formed thereupon the series of stress reducing layers 14a, 14b and 14c has been laminated to a partially fabricated semiconductor substrate 20 by means of a series of adhesive layers 24a, 24b and 24c. Similarly, as is also illustrated within the schematic cross-sectional diagram of FIG. 5, the series of patterned monocrystalline silicon substrate regions 10a, 10b and 10c having formed thereupon the series of stress reducing layers 14a, 14b and 14c is aligned with respect to the partially fabricated semiconductor substrate 20 such as to expose beneath each of the pair of stress reducing layer lined apertures 16a' and 16b' a pair of conductor contact layers 22a and 22b formed within the partially fabricated semiconductor substrate 20.

As is understood by a person skilled in the art, and in accord with additional disclosure below, within the preferred embodiment of the present invention the pair of conductor contact layers 22a and 22b is intended as a pair of microelectronic inductor structure conductor contact layers.

Within the preferred embodiment of the present invention with respect to the series of adhesive layers 24a, 24b and 24c, the series of adhesive layers 24a, 24b and 24c may be formed from any of several adhesive materials as are otherwise generally conventional in the art of semiconductor integrated circuit microelectronic fabrication, including but not limited to thermally cured polymer adhesive materials, such as but not limited to epoxy polymer adhesive materials and urethane polymer adhesive materials, as well as photoactive adhesive materials, such as but not limited to photoresist photoactive adhesive materials. Typically and preferably, each of the series of adhesive layers 24a, 24b and 24c is formed to a thickness of from about 1 to about 10 $\mu$m.

Within the preferred embodiment of the present invention with respect to the partially fabricated semiconductor substrate 20, the partially fabricated semiconductor substrate 20 is intended as comprising a silicon semiconductor substrate having formed therein and thereupon (in addition to the pair of conductor contact layers 22a and 22b): (1) a series of microelectronic devices formed within and upon the silicon semiconductor substrate, as well as; (2) a series of additional layers and structures (such as but not limited to dielectric layers and structures and conductor layers and structures) formed thereover. As is understood by a person skilled in the art, other types of partially or completely fabricated microelectronic substrates may be substituted within the context of the present invention for the partially fabricated semiconductor substrate 20.

As is further in part illustrated within the schematic cross-sectional diagram of FIG. 5, and as is understood by a person skilled in the art, to fabricate the semiconductor integrated circuit microelectronic fabrication whose schematic cross-sectional diagram is illustrated in FIG. 5 from the semiconductor integrated circuit microelectronic fabrication whose schematic cross-sectional diagram is illustrated in FIG. 3 or whose schematic plan-view diagram is illustrated in FIG. 4 there is first provided the partially fabricated semiconductor substrate 20 having formed therein the pair of conductor contact regions 22a and 22b, and then coated at least either: (1) the upper surface of the partially fabricated semiconductor substrate 20; or (2) the lower surfaces of the patterned monocrystalline silicon substrate regions 10a, 10b and 10c having formed thereupon the series of stress reducing layers 14a, 14b and 14c. The adhesively coated partially fabricated semiconductor substrate 20 and/or the adhesive coated patterned monocrystalline silicon substrate regions 10a, 10b and 10c are then laminated. Under circumstances where at least the partially fabricated semiconductor substrate 22 is coated with a blanket adhesive layer and subsequently laminated, portions of the blanket adhesive layer exposed at the bottoms of the stress reducing layer laminated apertures 16a' and 16b' are removed employing methods as are appropriate to the material from which is formed the blanket adhesive layer, to thus leave exposed the pair of conductor contact regions 22a and 22b.

Finally, there is also shown within the schematic cross-sectional diagram of FIG. 5 the results of planarizing the upper surfaces of the series of conformal stress reducing layers 14a, 14b and 14c to form a series of planarized conformal stress reducing layers 14a', 14b' and 14c'. Such planarization may be effected employing methods and materials as are conventional in the art of semiconductor integrated circuit microelectronic fabrication, which will typically and preferably include chemical mechanical polish (CMP) planarization methods and materials. Similarly, such planarization may be effected before of after the lamination process as described above.

Figure 6:
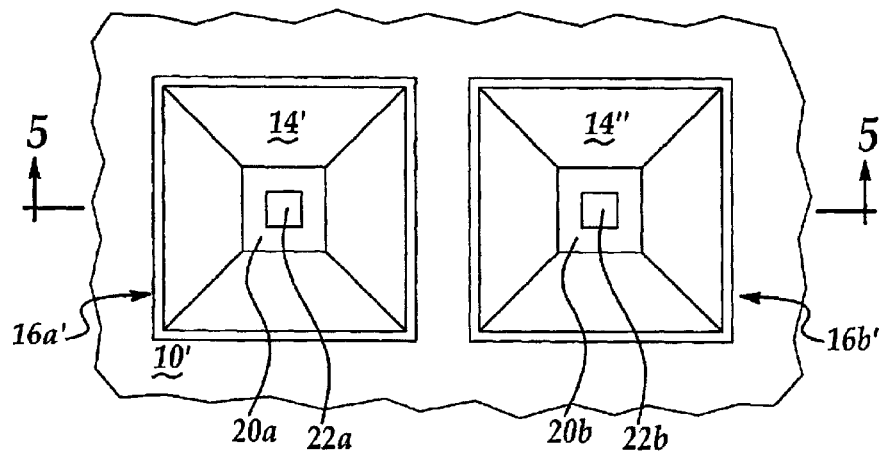

Referring now to FIG. 6, there is shown a schematic plan-view diagram of a semiconductor integrated circuit microelectronic fabrication corresponding with the semiconductor integrated circuit microelectronic fabrication whose schematic cross-sectional diagram is illustrated in FIG. 5.

Shown in FIG. 6 is a schematic plan-view diagram of a semiconductor integrated circuit microelectronic fabrication corresponding with the semiconductor integrated circuit microelectronic fabrication whose schematic plan-view diagram is illustrated in FIG. 4, but wherein there is illustrated the pair of conductor contact regions 22a and 22b exposed at the bottoms of the pair of stress reducing layer lined apertures 16a' and 16b', and surrounded by a pair of partially fabricated semiconductor substrate regions 22a and 22b intended as representative of the partially fabricated semiconductor substrate 20 as illustrated within the schematic cross-sectional diagram of FIG. 5. Similarly, there is also shown a pair of patterned conformal stress reducing layers 14' and 14 ' intended as representative of the series of planarized conformal stress reducing layers 14a', 14b' and 14c' as illustrated within the schematic cross-sectional diagram of FIG. 5. Finally, there is also shown a patterned monocrystalline substrate 10' intended as representative of the series of patterned monocrystalline silicon substrate regions 10a, 10b and 10c as illustrated within the schematic cross-sectional diagram of FIG. 5.

Figure 7:
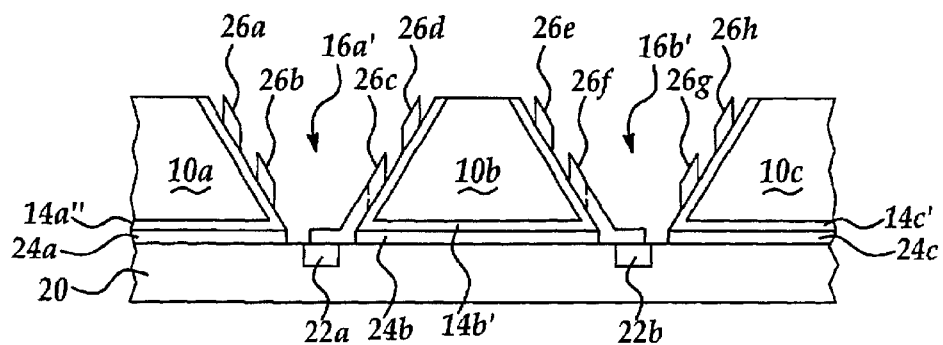

Referring now to FIG. 7, there is shown a schematic cross-sectional diagram illustrating the results of further processing of the semiconductor integrated circuit microelectronic fabrication whose schematic cross-sectional diagram is illustrated in FIG. 5 and whose schematic plan-view diagram is illustrated in FIG. 6.

Shown in FIG. 7 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 5 and whose schematic plan-view diagram is illustrated in FIG. 6, but wherein there is formed upon the planarized conformal stress reducing layers 14a, 14b and 14c within the pair of stress reducing layer lined apertures 16a' and 16b' a series of spirally patterned conductor layers 26a, 26b, 26c, 26d, 26e, 26f, 26g and 26h, of which the pair of spirally patterned conductor layers 26c and 26f contact the pair of conductor contact regions 22a and 22b within the partially fabricated semiconductor substrate 20.

As is also illustrated in part within the schematic cross-sectional diagram of FIG. 7, the series of spirally patterned conductor layers 26a, 26b, 26c, 26d, 26e, 26f, 26g and 26h conforms to the positive taper of the series of sidewalls of the pair of stress reducing layer lined apertures 16a' and 16b', as originally defined by the series of patterned monocrystalline silicon substrate regions 10a, 10b and 10c. Thus, as is understood by a person skilled in the art, and incident to being formed within the pair of stress reducing layer lined apertures 16a' and 16b' which are formed of "vortex" shape, each of the series of spirally patterned conductor layers 26a, 26b, 26c and 26d, and 26e, 26f, 26g and 26h is also formed of "vortex" shape in accord with the present invention.

Within the present invention and the preferred embodiment of the present invention, the series of spirally patterned conductor layers 26a, 26b, 26c, 26d, 26e, 26f, 26g and 26h may be formed employing methods as are conventional in the art of semiconductor integrated circuit microelectronic fabrication, and will generally employ seed layer deposition methods and photoresist mask electroplating methods as are generally conventional in the art of semiconductor integrated circuit microelectronic fabrication, when fabricating patterned conductor layers formed of copper containing conductor materials. In contrast, other deposition and patterning methods may be needed when forming spirally patterned conductor layers of other conductor (or partial conductor) materials.

Typically and preferably, each of the spirally patterned conductor layers 26a, 26b, 26c, 26d, 26e, 26f, 26g and 26h is formed of a thickness from about 0 to about $1 \times 10^5$ angstroms and a projected linewidth of from about 0 to about 50 microns, to provide the series of spirally patterned conductor layers (as is illustrated in greater detail in conjunction with disclosure below) spirally topographically positively tapered of "vortex" shape within the pair of stress reducing layer lined apertures 16a' and 16b'.

Figure 8:
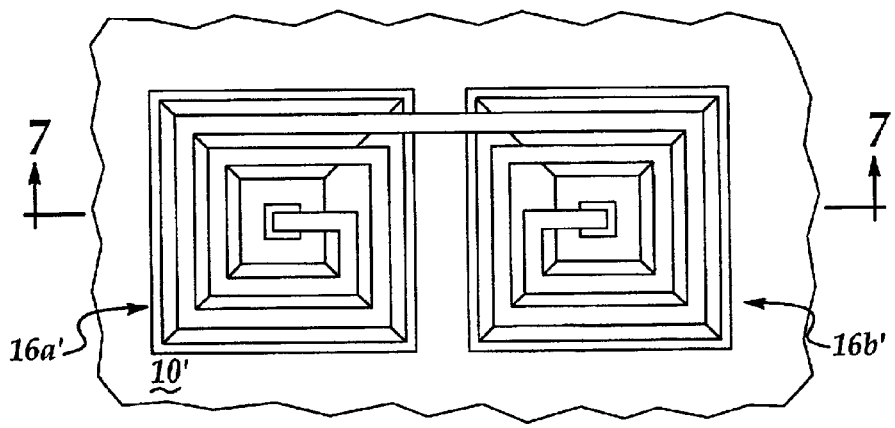

Referring now to FIG. 8, there is shown a schematic plan-view diagram of a semiconductor integrated circuit microelectronic fabrication corresponding with the semiconductor integrated circuit microelectronic fabrication whose schematic cross-sectional diagram of FIG. 7.

Figure 10:
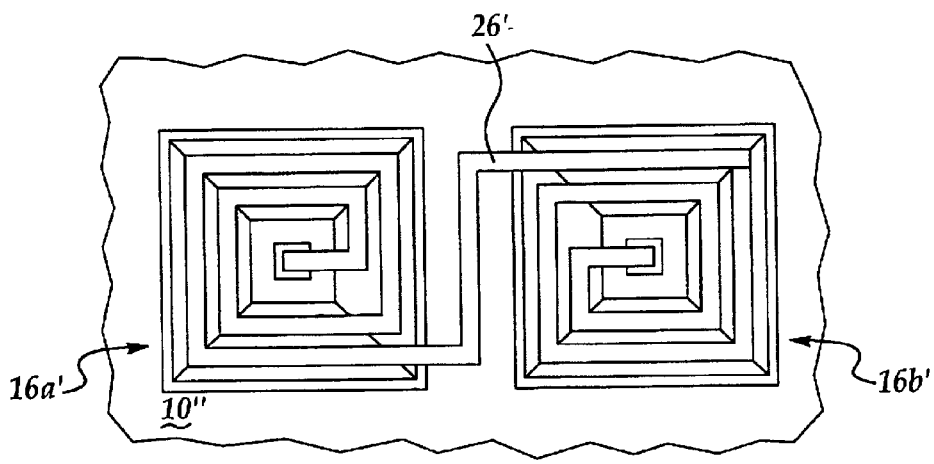

Shown in FIG. 8 is a schematic plan-view diagram of a semiconductor integrated circuit microelectronic fabrication which corresponds generally with the semiconductor integrated circuit microelectronic fabrication whose schematic plan-view diagram is illustrated in FIG. 6, but wherein there is formed a spirally patterned conductor layer 26 which corresponds with the series of spirally patterned conductor layers 26a, 26b, 26c, 26d, 26e, 26f, 26g, and 26h. Although the spirally patterned conductor layer is illustrated in terms of two loops within each of the stress reducing layer lined apertures 16a' and 16b', a greater number of loops (up to about 500, or from about 0 to about 500 is also feasible within the present invention. Similarly, while the preferred embodiment of the present invention illustrates a spirally patterned conductor layer formed in a "vortex" shape with its pointed end directed towards a substrate by forming the same within a tapered sided aperture, a reverse disposition of the "vortex" may be effected by forming a correlating spirally patterned conductor layer upon tapered sidewalls of a mesa, rather than within an aperture, rather than within an aperture. In addition, while the preferred embodiment of the present invention in accord with the schematic plan view diagram of FIG. 8 illustrates the present invention within the context of the spirally patterned conductor layer 26 formed in a dual "vortex" shape of both (i.e. opposite) spiral tapers, a micro fabrication (such as a semiconductor integrated circuit microelectronic fabrication) having formed therein a spirally patterned conductor layer in a dual "vortex" shape with only a single unidirectional spiral taper within each "vortex" within the dual "vortex" shape is also within the context of the present invention. A schematic plan view diagram of such a micro fabrication illustrating in part such a spirally patterned conductor layer is illustrated within the schematic plan view diagram of FIG. 10, which otherwise corresponds with (and may be further processed in accord with) the schematic plan view diagram of FIG. 8, but wherein there is employed an "S" shaped spirally patterned conductor layer 26' to provide the dual "vortex" shape of single unidirectional spiral taper.

Figure 9:
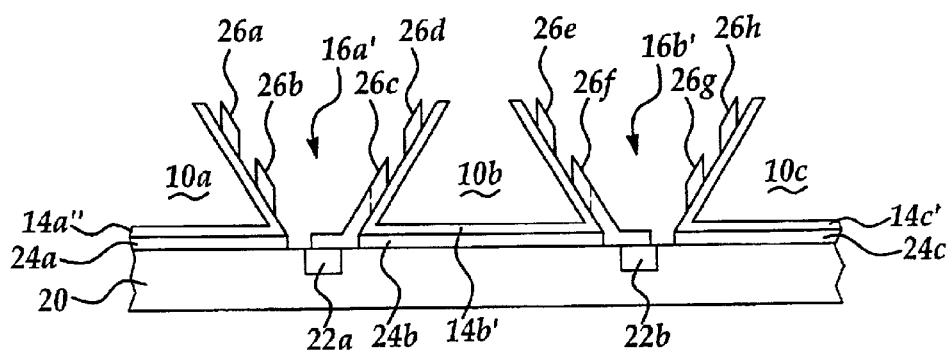

Referring now to FIG. 9, there is shown a schematic cross-sectional diagram illustrating the results of further processing of the semiconductor integrated circuit microelectronic fabrication whose schematic cross-sectional diagram is illustrated in FIG. 7 and whose schematic plan-view diagram is illustrated in FIG. 8.

Shown in FIG. 9 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 7, but wherein there has been stripped the series of patterned monocrystalline silicon substrate regions 10a, 10b and 10c therefrom to form at least in part beneath the series of spirally patterned conductor layers 26a, 26b, 26c, 26d, 26e, 26f, 26g and 26h a series of air gaps.

Within the preferred embodiment of the present invention, the series of patterned monocrystalline silicon substrate regions 10a, 10b and 10c may be stripped employing etchants as are otherwise generally conventional in the art of semiconductor integrated circuit microelectronic fabrication. Such etchants may include, but are not limited to, wet chemical etchants and dry plasma etchants.

Upon fabricating the semiconductor integrated circuit microelectronic fabrication whose schematic cross-sectional diagram is illustrated in FIG. 9, there is provided in accord with the preferred embodiment of the present invention a semiconductor integrated circuit microelectronic fabrication having efficiently fabricated therein a microelectronic inductor structure with enhanced performance.

In a first instance the microelectronic inductor structure is efficiently fabricated within the semiconductor integrated circuit microelectronic fabrication insofar as it is formed in a laminated fashion such that areal requirements of the microelectronic inductor structure do not significantly obscure areal portions of a semiconductor substrate employed within the semiconductor integrated circuit microelectronic fabrication. Similarly, in a second instance, the microelectronic inductor structure is fabricated with enhanced performance within the semiconductor integrated circuit microelectronic fabrication insofar as the microelectronic inductor structure is fabricated with a spirally patterned conductor layer which is spirally topographically positively tapered upon a positively tapered sidewall of a "vortex" shaped aperture within a substrate within which it is formed. In that regard, and in comparison with a corresponding planar spiral inductor structure, it is expected that the "vortex" shaped topographic spiral inductor structure of the present invention will exhibit attenuated internal capacitance incident to being formed topographically. Yet similarly, the presence of an air gap beneath the microelectronic inductor structure provides for additional performance enhancement due to mitigation of capacitive coupling to a substrate over which is formed the microelectronic inductor structure of the present invention. As is understood by a person skilled in the art microelectronic inductor structure performance may be measured in terms of a Q value.

As is understood by a person skilled in the art, the preferred embodiment of the present invention is illustrative of the present invention rather than limiting of the present invention. Revisions and modifications may be made to methods, materials, structures and dimensions employed for fabricating a semiconductor integrated circuit microelectronic fabrication in accord with the preferred embodiment of the present invention, while still providing a micro fabrication in accord with the present invention, and a method for fabrication thereof in accord with the present invention, further in accord with the appended claims.

What is claimed is:

1. A micro fabrication comprising:
    a substrate; and
    a spirally patterned conductor layer formed over the substrate, the spirally patterned conductor layer being spirally topographically tapered in a vortex shape, wherein the vortex shape has an open end across dimension of from about 50 to about 900 microns and a height of from about 50 to about 600 microns.

2. The micro fabrication of claim 1 wherein the spirally patterned conductor layer is employed within a micro structure selected from the group consisting of microelectronic inductor structures, microelectronic resonator structures, microelectronic waveguide structures, micromechanical spring structures, microelectronic interconnect structures, microelectromagnetic valve structures, microelectromechanical resistive cavity heater structures and microelectromagnetic suspension structures.

3. The micro fabrication of claim 1 wherein a pointed end of the vortex is directed towards the substrate.

4. The microelectronic fabrication of claim 1 wherein the spirally patterned conductor layer is employed within a microelectronic inductor structure.

5. The microelectronic fabrication of claim 1 wherein a pointed end of the vortex is directed towards the substrate.

6. A method for fabricating a micro fabrication comprising:
    providing a substrate; and
    forming over the substrate a spirally patterned conductor layer, the spirally patterned conductor layer being spirally topographically tapered in a vortex shape, wherein the vortex shape has an open end across dimension of from about 50 to about 900 microns and a height of from about 50 to about 600 microns.

7. The method of claim 6 wherein the spirally patterned conductor layer is employed within a micro structure selected from the group consisting of microelectronic inductor structures, microelectronic resonator structures, microelectronic waveguide structures, micromechanical spring structures, microelectronic interconnect structures, microelectromagnetic valve structures, microelectromechanical resistive cavity heater structures and microelectromagnetic suspension structures.

8. The method of claim 6 wherein a pointed end of the vortex is directed towards the substrate.

9. The method of claim 6 wherein the spirally patterned conductor layer is employed within a microelectronic inductor structure.

10. The method of claim 6 wherein a pointed end of the vortex is directed towards the substrate.

* * * * *